(12) United States Patent
Cheng et al.

(10) Patent No.: US 9,899,378 B2
(45) Date of Patent: *Feb. 20, 2018

(54) SIMULTANEOUSLY FABRICATING A HIGH VOLTAGE TRANSISTOR AND A FINFET

(71) Applicant: International Business Machines Corporation, Armonk, NY (US)

(72) Inventors: Kangguo Cheng, Schenectady, NY (US); Ali Khakifirooz, Los Altos, CA (US); Alexander Reznicek, Troy, NY (US); Charan V. V. S. Surisetty, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/967,441

(22) Filed: Dec. 14, 2015

(65) Prior Publication Data

US 2017/0170172 A1 Jun. 15, 2017

(51) Int. Cl.
| | |
|---|---|
| H01L 21/336 | (2006.01) |
| H01L 27/088 | (2006.01) |
| H01L 29/04 | (2006.01) |
| H01L 21/8234 | (2006.01) |

(52) U.S. Cl.
CPC .. *H01L 27/0886* (2013.01); *H01L 21/823412* (2013.01); *H01L 21/823418* (2013.01); *H01L 21/823431* (2013.01); *H01L 21/823468* (2013.01); *H01L 29/04* (2013.01)

(58) Field of Classification Search
USPC .......................................................... 438/586
See application file for complete search history.

(56) References Cited

U.S. PATENT DOCUMENTS

| | | | |
|---|---|---|---|
| 6,844,577 B2 | 1/2005 | Manning | |
| 7,189,603 B2 | 3/2007 | Hotta | |
| 7,256,092 B2 | 8/2007 | Chen et al. | |
| 7,368,354 B2 | 5/2008 | Anderson et al. | |

(Continued)

OTHER PUBLICATIONS

IBM: List of IBM Patents or Patent Applications Treated as Related (Appendix P), Feb. 16, 2016, 2 pages.

(Continued)

*Primary Examiner* — Dale E Page
*Assistant Examiner* — Wilner Jean Baptiste
(74) *Attorney, Agent, or Firm* — Michael O'Keefe (57) ABSTRACT

Forming a semiconductor layer on a semiconductor substrate, a top surface of the semiconductor layer above a fin in a second region is higher than a top surface of the semiconductor layer in a first region, etching the semiconductor layer and a mask in the first region to expose a top surface of the semiconductor substrate to form a first stack, and etching the semiconductor layer and the mask in the second region to expose a top surface of the fin to form a second stack, epitaxially growing a semiconductor material on a top surface of the fin not covered by the second stack, recessing the first and second stack to expose a top surface of the semiconductor layer, a portion of the mask remains above the semiconductor layer in the first stack, top surfaces of each of the first and second stacks each are substantially flush with one another.

13 Claims, 10 Drawing Sheets (56) References Cited

U.S. PATENT DOCUMENTS

| | | | |
|---|---|---|---|
| 8,728,886 B2* | 5/2014 | Hall | H01L 29/66825 |
| | | | 257/E21.084 |
| 8,822,289 B2 | 9/2014 | Fang et al. | |
| 8,859,371 B2 | 10/2014 | Song et al. | |
| 9,059,115 B2* | 6/2015 | Kewley | H01L 21/0337 |
| 2006/0246637 A1 | 11/2006 | Voutsas et al. | |
| 2008/0254585 A1 | 10/2008 | Takaya | |
| 2009/0090976 A1 | 4/2009 | Kavalieros et al. | |
| 2013/0288471 A1* | 10/2013 | Chi | H01L 29/665 |
| | | | 438/586 |
| 2014/0264485 A1 | 9/2014 | Li et al. | |
| 2014/0273376 A1 | 9/2014 | Kalnitsky et al. | |
| 2014/0284723 A1 | 9/2014 | Lee et al. | |
| 2015/0155280 A1 | 6/2015 | Erickson et al. | |
| 2017/0025533 A1 | 1/2017 | Phoa et al. | |

OTHER PUBLICATIONS

Pending U.S. Appl. No. 15/044,169, filed Feb. 16, 2016, entitled: "Semiconductor High Voltage Transistor and FET Fabrication", 31 pages.

\* cited by examiner

Figure 10

SIMULTANEOUSLY FABRICATING A HIGH VOLTAGE TRANSISTOR AND A FINFET

BACKGROUND

The present invention generally relates to semiconductor manufacturing, and more particularly to fabricating high voltage transistors and field effect transistors (FET).

Complementary Metal-oxide-semiconductor (CMOS) technology is commonly used for FETs as part of advanced integrated circuits (IC), such as central processing units (hereinafter "CPUs"), memory, storage devices, and the like. A high voltage transistor is a structure that can operate at a higher voltage than a CMOS FET.

A high voltage transistor can be used as a power converter, as a select transistor for an anti-fuse, for external drivers, among other uses.

SUMMARY

According to one embodiment of the present invention, a method is provided. The method may include conformally forming a semiconductor layer on a semiconductor substrate having a first region and a second region, where a top surface of the semiconductor layer above a fin in the second region is at a greater height than a top surface of the semiconductor layer in the first region, where the height is measured relative to a top surface of the semiconductor substrate, forming a mask on the semiconductor layer, etching the semiconductor layer and the mask in the first region to expose a top surface of the semiconductor substrate to form a first stack, and etching the semiconductor layer and the mask in the second region to expose a top surface of the fin to form a second stack, epitaxially growing a semiconductor material on a top surface of the fin which is not covered by the second stack, recessing the first and second stack to expose a top surface of the semiconductor layer in the second stack, where a portion of the mask remains above the semiconductor layer in the first stack, where top surfaces of each of the first and second stacks each are substantially flush with one another, forming a first pair of sidewall spacers on opposite sidewalls of the first stack, and forming a gate adjacent to and in direct contact with at least one of the first pair of sidewall spacers.

According to another embodiment, a method is provided. The method may include conformally forming a semiconductor layer on a semiconductor substrate having a first region and a second region, where a top surface of the semiconductor layer above a fin in the second region is at a greater height than a top surface of the semiconductor layer in the first region, where the height is measured relative to a top surface of the semiconductor substrate, forming a mask on the semiconductor layer, etching the semiconductor layer and the mask in the first region to expose a top surface of the semiconductor substrate to form a first stack, and etching the semiconductor layer and the mask in the second region to expose a top surface of the fin to form a second stack, epitaxially growing a semiconductor material on a top surface of the fin which is not covered by the second stack, and recessing the first and second stack to expose a top surface of the semiconductor layer in the second stack, where a portion of the mask remains above the semiconductor layer in the first stack, where top surfaces of each of the first and second stacks each are substantially flush with one another.

According to another embodiment, a structure is provided. The structure may include a semiconductor substrate, where the semiconductor substrate has a first region and a second region, where the first region includes a channel, where the channel includes a semiconductor layer, where a top surface of the semiconductor layer is essentially coplanar with a bottom surface of a mask, a gate including a sidewall spacer, where a sidewall of the sidewall spacer is essentially coplanar with a sidewall of the semiconductor, and a source drain region, the second region includes an epitaxially grown source drain region above and in direct contact with a fin of the semiconductor substrate, a second region sidewall spacer, where the second region sidewall spacer has a sidewall which is essentially coplanar with a sidewall of the epitaxially grown source drain region, and a gate, where a top surface of a gate contact is essentially coplanar with a top surface of the mask in the first region, and where the sidewall spacer of the first region serves as a gate dielectric, and is the same material and thickness as the second region sidewall spacer.

BRIEF DESCRIPTION OF THE DRAWINGS

The following detailed description, given by way of example and not intended to limit the invention solely thereto, will best be appreciated in conjunction with the accompanying drawings, in which.

Elements of the figures are not necessarily to scale and are not intended to portray specific parameters of the invention. For clarity and ease of illustration, scale of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The formation of the high voltage transistor according to the present disclosure can be implemented in the back-end-of-line (BEOL), and is compatible with semiconductor manufacture process flows. The present invention thus allows the high voltage transistor to be fabricated during manufacture of CMOS FETs and other circuitry at the same time, thus advantageously reducing processing costs compared to manufacturing high voltage transistors fabricated during an alternate process flow.

The present invention generally relates to semiconductor manufacturing and more particularly to fabricating a high voltage transistor and a field effect transistors (FET) in the same process flow. One way to fabricate both the high voltage transistor and the FET may include fabricating a polysilicon layer which covers a fin. A top of the polysilicon layer may be at a higher level from a substrate compared to the polysilicon layer directly on the substrate where there is not a fin. A high voltage transistor may be fabricated in a portion of the area where there is not a fin. A mask may be deposited on the substrate, covering the polysilicon layer. Upon subsequent processing, an etch may remove the mask in an area of the fin and a portion of the mask may remain in an area of the high voltage transistor, due to the higher level of the polysilicon layer and the mask covering the fin. A remaining portion of the mask may protect the high voltage transistor from several processing steps in the area of the fin, allowing separate processing in the area of the fin and the area of the high voltage transistor. The resulting structure may include a high voltage transistor and an FET. A higher level metal layer including a wiring level may be formed on the resulting structure and may contain circuitry to control the high voltage transistor and the FET.

A method of manufacturing a semiconductor with one or more high voltage transistors and one or more FETs, or an array of FETS, in the same process flow is described in detail below by referring to the accompanying drawings in FIGS. 1-10, in accordance with an illustrative embodiment.

Figure 1:
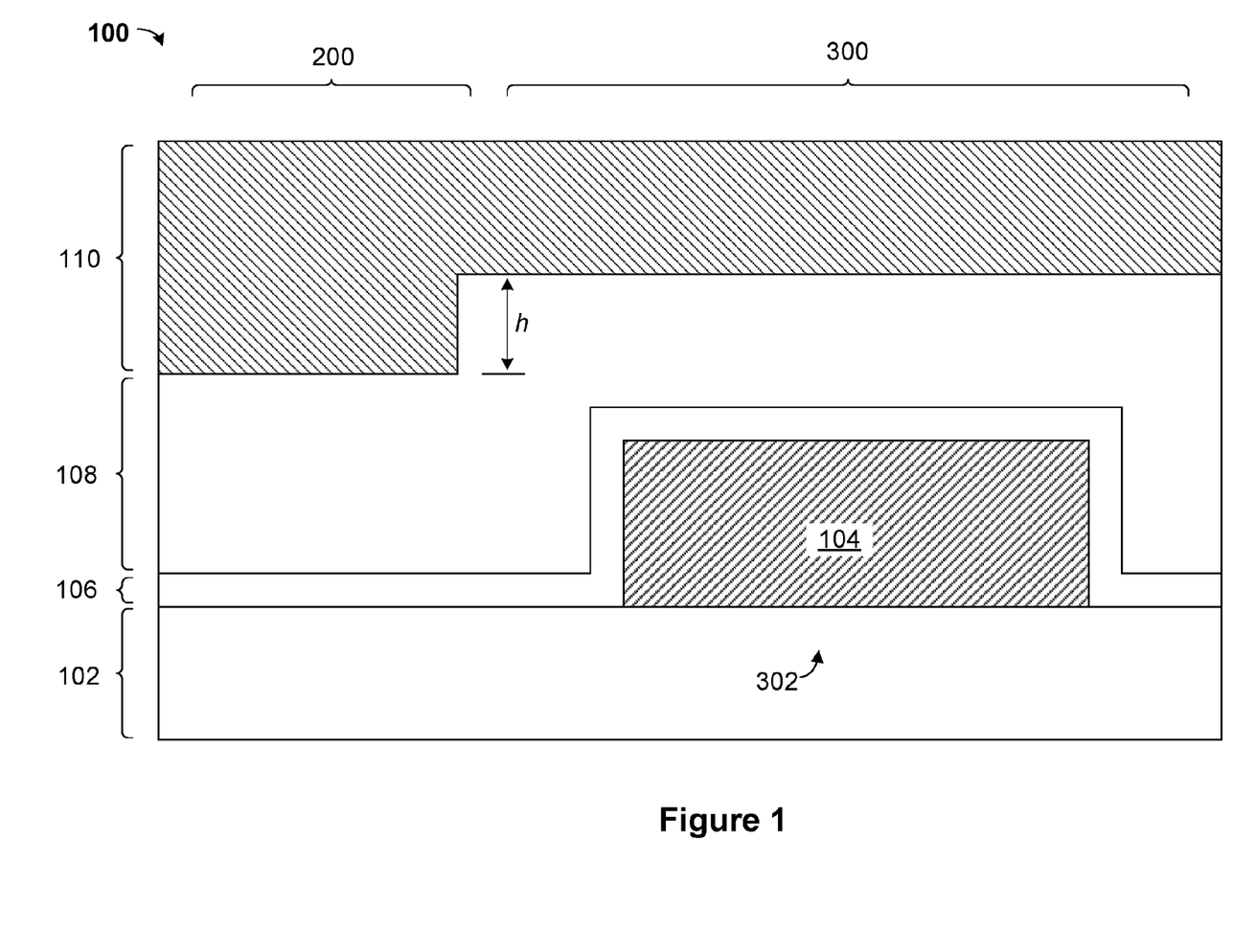
FIG. 1 is a cross-sectional view of a semiconductor structure at an intermediate stage of fabrication, according to an exemplary embodiment.

Referring now to FIG. 1, a semiconductor structure 100 (hereinafter "structure") is shown according to an exemplary embodiment. The structure 100 may include a substrate 102. The substrate 102 may include an inactive region 200 and an active region 300. The inactive region 200 may include an insulator (e.g., oxide) on a substrate. A fin 104 may be formed on the substrate 102 in the active region 300. The active region 300 may include a doped region below the fin 104. Additional structures, (not shown), may be formed on the substrate 102. In an embodiment, an isolation region may be formed between the inactive region 200 and the active region 300.

The structure 100 of FIG. 1 may be formed or provided. At this step of the manufacturing process, the beginning structure of a field effect transistor (hereinafter "FET") 302 is shown. The FET 302 may preferably be fabricated in the active region 300. The FET 302 may be formed on the substrate 102 as shown in FIG. 1 according to techniques known in the art.

A FinFET device may include a plurality of fins formed in a wafer; a gate covering a portion of the fins, where the portion of the fins covered by the gate serves as a channel region of the device and portions of the fins extending out from under the gate may serve as source and drain regions of the device; and a pair of device spacers on opposite sides of the gate. It should be noted that the invention disclosed below may be fabricated using either a replacement gate or gate last process flow, or a gate first process flow. A replacement gate process flow will be relied on for the description provided below.

In a replacement gate (RG) fabrication approach, the substrate 102 may be patterned and etched to form active device region (e.g., fins). Next, one or more dummy gates may be formed in a direction perpendicular to the length of the fins. For example, the dummy gates may be pattered and etched from a polysilicon layer. A pair of sidewall spacers, can be disposed on opposite sidewalls of the dummy gates.

The dummy gates and the pair of sidewall spacers may then be surrounded by an inter-level dielectric. Later, the dummy gates may be removed from between the pair of device spacers. This creates an opening between the pair of device spacers where a metal gate, may then be formed between the pair of device spacers. Optionally, a gate dielectric may be configured below the metal gate.

The substrate 102 may be a bulk substrate, which may be made from any of several known semiconductor materials such as, for example, silicon, germanium, silicon-germanium alloy carbon-doped silicon-germanium alloy, and compound (e.g. III-V and II-VI) semiconductor materials. Non-limiting examples of compound semiconductor materials include gallium arsenide, indium arsenide, and indium phosphide. In other embodiments, the substrate 102 may be, for example, a layered semiconductor such as Si/SiGe, a silicon-on-insulator, or a SiGe-on-insulator, where a buried insulator layer separates a base substrate from a top semiconductor layer. In such cases, components of the structure 100 may be formed in or from the top semiconductor layer of the SOI substrate. Typically the substrate 102 may be approximately, but is not limited to, several hundred microns thick. The substrate 102 may include additional structures (not shown) such as shallow trench isolation (STI) and/or doped regions.

In an embodiment, the FET 302 may be fabricated as a FinFET device, nanowire device, planar MOSFET, or any suitable combination of those devices. In general, a FinFET device may include a plurality of fins formed in the substrate 102. In the present embodiment, a gate may be perpendicular to and cover a portion of one or more fins. The portion of the fin covered by the gate may serve as a channel region of the FET 302. Portions of the fin extending out from under each of the gates may serve as source and drain regions for the FET 302. In this example, the FinFET may be formed from the substrate 102 using known photolithography and etch processes. It should also be noted, that in the context of FinFET devices the portion of the substrate 102 illustrated in the figures represents a cross-section view along a length direction of the fin 104. A dielectric layer 106 and a semiconductor layer 108 are illustrated as being disposed directly on top of the fin 104, according to the present embodiment. In an embodiment, the FET 302 may have a vertical thickness, or height, ranging from about 20 nm to 100 nm, and ranges there between, although a thickness less than 20 nm and greater than 100 nm may be acceptable. The semiconductor layer 108 may include silicon, silicon germanium, germanium, or any other semiconductor materials. The semiconductor layer 108 can be deposited as amorphous or polycrystalline (poly).

The dielectric layer 106 may be conformally formed directly on the exposed top surfaces of the structure 100, according to an exemplary embodiment. The dielectric layer 106 may include a dielectric material such as an oxide, nitride, oxynitride, silicon carbon oxynitride, silicon boron oxynitride, high-k dielectric, or any combination thereof. In an embodiment, the dielectric layer 106 may be deposited using typical deposition techniques, for example, nitridation, atomic layer deposition (ALD), molecular layer deposition (MLD), chemical vapor deposition (CVD), physical vapor deposition (PVD), and spin on techniques. In an alternate embodiment the dielectric layer 106 may be deposited using thermal oxidation as a deposition technique. In this alternate embodiment, the dielectric layer 106 is formed on exposed surfaces of the fin 104, and the dielectric layer 106 is not formed in the inactive region 200 which is already covered by dielectric material (e.g., oxide). In an embodiment, the dielectric layer 106 may include one or more layers. In an embodiment, the dielectric layer 106 may have a vertical thickness, or height, ranging from about 2 nm to 20 nm, and ranges there between, although a thickness less than 2 nm and greater than 20 nm may be acceptable.

The semiconductor layer 108 may be conformally formed directly on the exposed top surfaces of the structure 100, according to an exemplary embodiment. The semiconductor layer 108 may be formed using known techniques. The material of the semiconductor layer 108 may include polycrystalline or amorphous silicon, germanium, silicon germanium, carbon nanotube, graphene, or any suitable combination of these materials. The semiconductor layer 108 material may further include dopants that are incorporated during or after deposition. The semiconductor layer 108 may be deposited using typical deposition techniques, for example, atomic layer deposition (ALD), molecular layer deposition (MLD), chemical vapor deposition (CVD), physical vapor deposition (PVD), and spin on techniques. In an embodiment, the semiconductor layer 108 may be deposited via CVD. In an embodiment, the semiconductor layer 108 may include one or more layers. In an embodiment, the semiconductor layer 108 may have a vertical thickness, or height, ranging from about 50 nm to 150 nm, and ranges there between, although a thickness less than 50 nm and greater than 150 nm may be acceptable.

It should be noted that a difference in a height of a top surface of the semiconductor layer 108 in the active region 300 may be a height 'h', compared to a height of a top surface of the semiconductor layer 108 in the inactive region 200, when compared to a top surface of the substrate 102. This difference in height 'h' may be due to the conformal deposition of the semiconductor layer 108 on the fin 104 in the active region 300 compared to the conformal deposition of the semiconductor layer 108 on an area in the inactive region 200 which does not have a fin 104.

In an embodiment, the semiconductor layer 108 may serve as a channel in the inactive region 200, for a high voltage transistor.

A mask 110 may be conformally formed on the semiconductor layer 108. The mask 110 may be a hardmask which directly covers the inactive region 200 and the active region 300. The mask 110 may be deposited and polished using a chemical mechanical polishing (CMP) technique, as illustrated. A vertical thickness of the mask 110 in the inactive region 200 may be greater than a vertical thickness of the mask in the active region 300, as a result of the CMP and the height 'h' as described above. In an embodiment, a difference in the vertical thickness difference of the mask 110 in the inactive region 200 and the vertical thickness of the mask 110 above the fin 104 in the active region 300 may range from about 10 nm to 30 nm, and ranges there between, although a difference less than 10 nm and greater than 30 nm may be acceptable. In an embodiment, the mask 110 may have a vertical thickness, or height, ranging from about 50 nm to 300 nm, and ranges there between, although a thickness less than 50 nm and greater than 300 nm may be acceptable.

Figure 2:
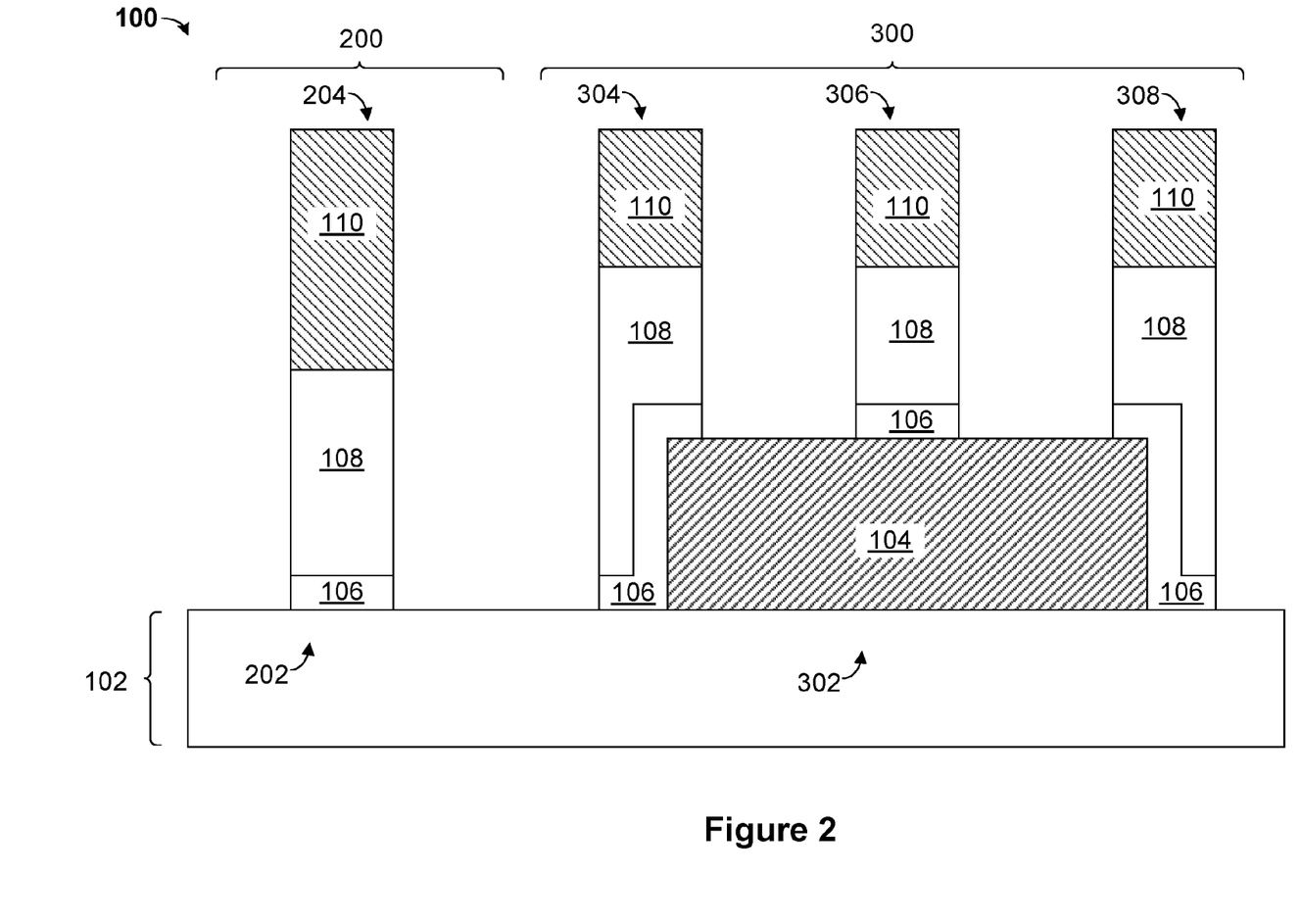
FIG. 2 is a cross-sectional view of the semiconductor structure and illustrates the formation of a first, second, third and fourth stack, according to an exemplary embodiment.

Referring now to FIG. 2, a first stack 204, a second stack 304, a third stack 306 and a fourth stack 308 may be formed using any known patterning technique. In an embodiment, the stacks are formed by lithography and etch techniques. Alternatively, the first, second, third and fourth stacks 204, 304, 306, 308 may be patterned by sidewall image transfer (SIT) technique. Portions of the dielectric layer 106, the semiconductor layer 108 and the mask 110 are removed between the first, second, third and fourth stacks 204, 304, 306, 308. The first stack 204 may be in the inactive region 200 and the second stack 304, third stack 306 and the fourth stack 308 may be in the active region 300. The first, second, third and fourth stacks 204, 304, 306, 308 may each have the same or different horizontal widths. In an embodiment, a horizontal width of the first stack 204 may range from 50 nm to 150 nm, although a width less than 50 nm and greater than 150 nm may be acceptable. A horizontal width of the second, third and fourth stacks 304, 306 and 308, may range from 10 nm to 50 nm, although a width less than 10 nm and greater than 50 nm may be acceptable. The first stack 204 may be adjacent to an exposed top surface of the substrate 102. The third stack 306 may be adjacent to an exposed top surface of the fin 104. The second and fourth stacks 304, 308, may each have a first side adjacent to an exposed top surface of the substrate 102 and may each have a second side adjacent to an exposed top surface of the fin 104.

The beginning structure of a high voltage transistor 202 is shown. The high voltage transistor 202 may preferably be fabricated in the inactive region 200. The high voltage transistor 202 may be formed on the substrate 102 as shown in FIG. 2 according to techniques known in the art.

Figure 3:
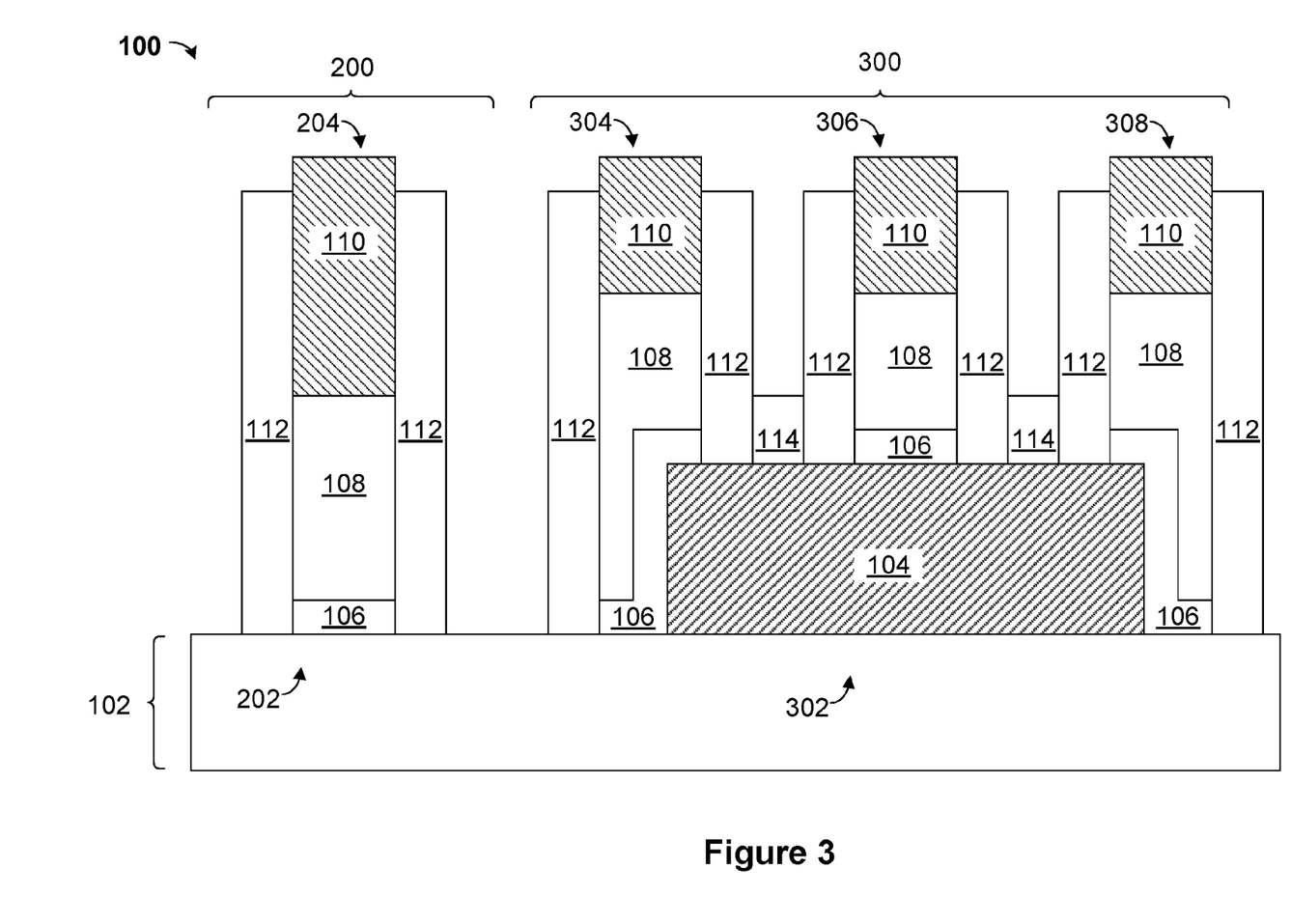
FIG. 3 is a cross-sectional view of the semiconductor structure and illustrates the formation of sidewall spacers and depicting an epitaxial growth, according to an exemplary embodiment.

Referring now to FIG. 3, sidewall spacers may be formed. A first pair of sidewall spacers 112 of the first stack 204 may be formed within the inactive region 200, on opposite sidewalls of the first stack 204. A second pair of sidewall spacers 112 may be formed on opposite sidewalls of the second stack 304, a third pair of sidewall spacers 112 may be formed on opposite sidewalls to the third stack 306, and a fourth pair of sidewall spacers 112 may be formed on opposite sidewalls of the fourth stack 308. The first, second, third and fourth pairs of sidewall spacers 112 may be formed by conformally depositing or growing a dielectric, followed by an anisotropic etch that removes the dielectric from the horizontal surfaces of the structure 100, while leaving it on the sidewalls of first, second, third and fourth stacks 204, 304, 306, 308. In an embodiment, the first, second, third and fourth pairs of sidewall spacers 112 may include any dielectric material such as silicon oxide, silicon oxynitride, silicon nitride, SiBCN, SiOC, low-k dielectric or any combination of these materials. The first, second, third and fourth pairs of sidewall spacers 112, may include a single layer; however, the first, second, third and fourth pairs of sidewall spacers 112, may include multiple layers of dielectric material. In an embodiment, the first, second, third and fourth pairs of sidewall spacers 112, may be silicon nitride. In an embodiment, the first, second, third and fourth pairs of sidewall spacers 112 may have a lateral thickness ranging from about 3 nm to about 20 nm, and ranges there between, although a thickness less than 3 nm and greater than 20 nm may be acceptable.

In an embodiment, the first pair of sidewall spacers 112 may serve as a gate dielectric for the high voltage transistor 202.

As illustrated, the first, second, third and fourth pairs of sidewall spacers 112 may be recessed due to overetch. A directional etch, for example an anisotropic vertical etch process such as a reactive ion etch (RIE), may be performed, and may remove an upper portion of the first, second, third and fourth pairs of sidewall spacers 112.

An epitaxy layer 114 may be formed in an opening between the second stack 304 and the third stack 306, as well as in an opening between the third stack 306 and the fourth stack 308. The epitaxy layer 114 may be formed by selective deposition on exposed surfaces of the fin 104. Examples of various epitaxial growth techniques used in forming the epitaxy layer 114 may include, for example, rapid thermal chemical vapor deposition, low energy cluster beam deposition, ultra-high vacuum chemical vapor deposition, and atmospheric pressure chemical vapor deposition. The epitaxy layer 114 may be formed directly on the fin 104. The epitaxy layer 114 may be doped during epitaxy process (in-situ doping) or after epitaxy process (ex-situ doping). A non limiting list of exemplary epitaxial materials are: silicon germanium alloy (SiGe), Silicon (Si), in-situ boron doped SiGe or Si, in situ phosphorus or arsenic doped Si or SiGe, with doping levels ranging from $1E19/cm^3$ to $1.5E21$ $cm^3$, with $4E20$ $cm^3$ to $9E20$ $cm^3$ dopant levels preferred. The epitaxy layer 114 may serve as source/drain regions of the FET 302 in the active region 300. Thermal anneal such as laser anneal, rapid thermal anneal, flash anneal may be performed to activate dopants and formed junctions. In an embodiment, silicide may be formed on a surface of the epitaxy layer 114 to reduce the contact resistance of the FET 302.

Figure 4:
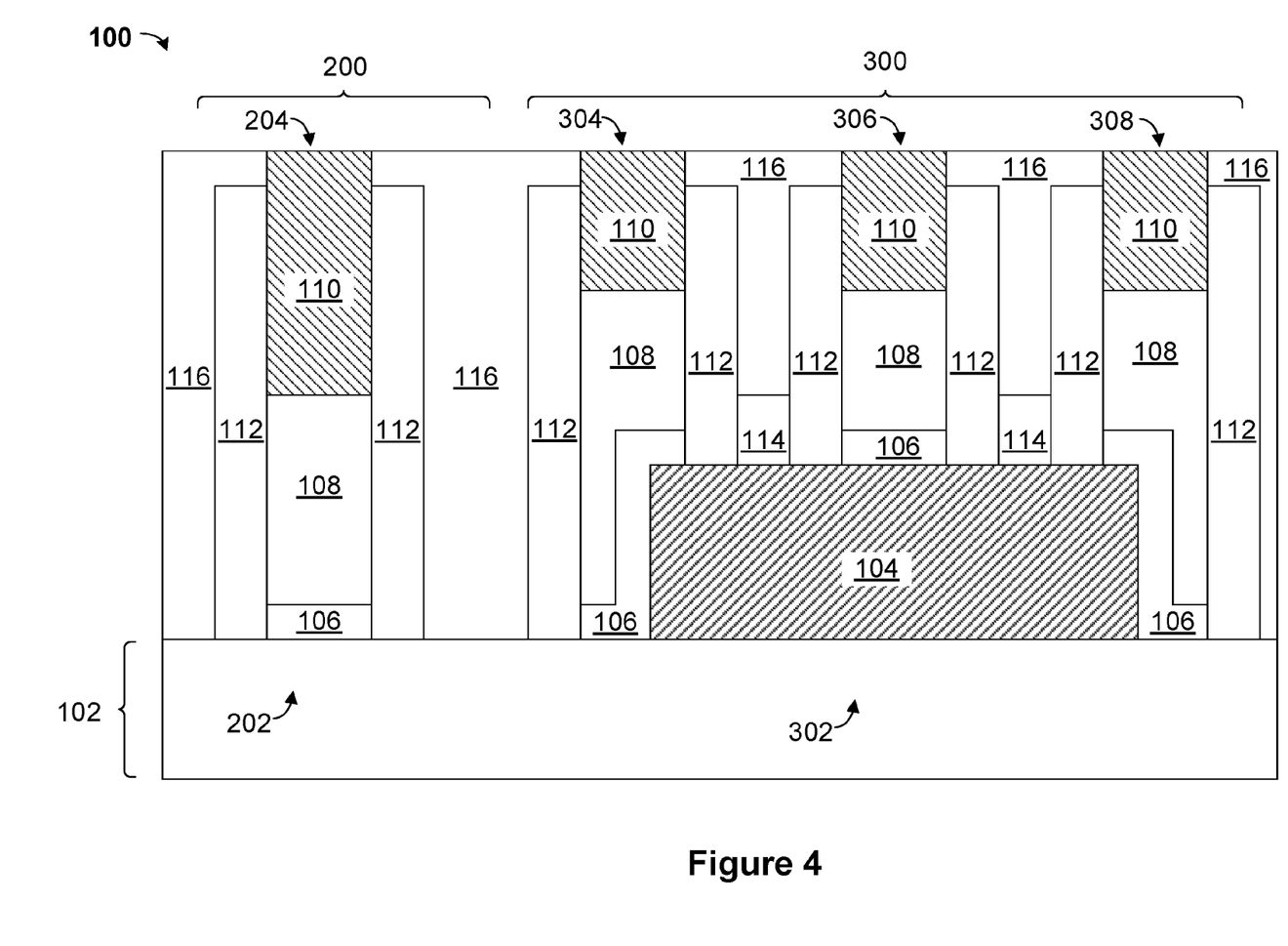
FIG. 4 is a cross-sectional view of the semiconductor structure and illustrates the formation of a second dielectric layer, according to an exemplary embodiment.

Referring now to FIG. 4, a second dielectric layer 116 may be formed. The second dielectric layer 116 may also be referred to as a middle-of-line (hereinafter "MOL") dielectric. The second dielectric layer 116 may be formed directly on the exposed top surfaces of the structure 100, according to an exemplary embodiment. The second dielectric layer 116 may be made from an insulator material such as an oxide, nitride, oxynitride, silicon carbon oxynitride, silicon boron oxynitride, low-k dielectric, or any combination thereof. The second dielectric layer 116 may be deposited using typical deposition techniques, for example, atomic layer deposition (ALD), molecular layer deposition (MLD), chemical vapor deposition (CVD), physical vapor deposition (PVD), high density plasma (HDP) deposition, and spin on techniques. In an embodiment, the second dielectric layer 116 may include one or more layers. The second dielectric layer 116 may be polished using a chemical mechanical polishing (CMP) technique, as illustrated. The second dielectric layer 116 may be formed between the first, second, third and fourth stacks 204, 304, 306, 308. The second dielectric layer 116 between the first stack 204 and the second stack 304 may have a bottom surface substantially flush with a top surface of the substrate 102. The second dielectric layer 116 between the second stack 304 and the third stack 306 may have a bottom surface substantially flush with a top surface of the epitaxy layer 114. The second dielectric layer 116 between the third stack 306 and the fourth stack 308 may have a bottom surface substantially flush with a top surface of the epitaxy layer 114.

Figure 5:
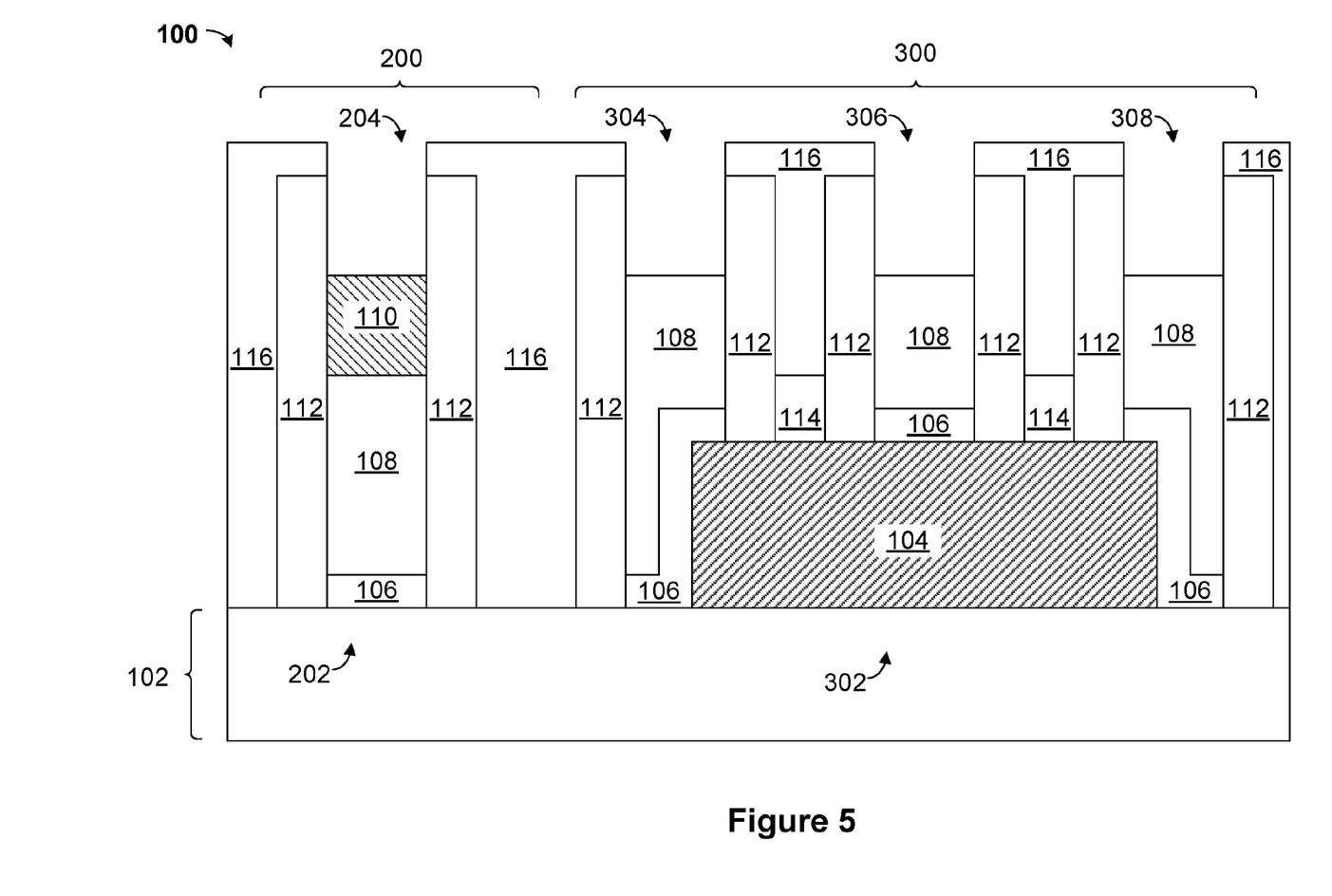
FIG. 5 is a cross-sectional view of the semiconductor structure and illustrates the selective removal of a portion of the first, second, third and fourth stacks, according to an exemplary embodiment.

Referring now to FIG. 5, a portion of the mask 110 may be removed via an anisotropic vertical etch process such as a reactive ion etch (RIE), via an isotropic etch process such as hot phosphoric acid to etch silicon nitride, or via the combination of any suitable etch process. The total etch amount is equal or greater than the vertical thickness of the mask 110 in the active region 300 before etch, but less than the vertical thickness of the mask 110 in the inactive region 200 before etch. As a result, the mask 110 is removed in the active region but a portion of the mask 110 remain in the inactive region. The mask 110 of the second, the third and the fourth stacks 304, 306, 308, may be removed until a top surface of the semiconductor layer 108 is exposed. A top portion of the mask 110 in the first stack 204 may be removed until a top surface of the mask 110 in the first stack is substantially flush with a top surface of the semiconductor layer 108 of the second, the third and the fourth stacks 304, 306, 308. A remaining portion of the mask 110 in the first stack 204 remains due to the height 'h', the difference in a height of a top surface of the semiconductor layer 108 in the active region 300, compared to a height of a top surface of the semiconductor layer 108 in the inactive region 200, relative to a top surface of the substrate 102.

Figure 6:
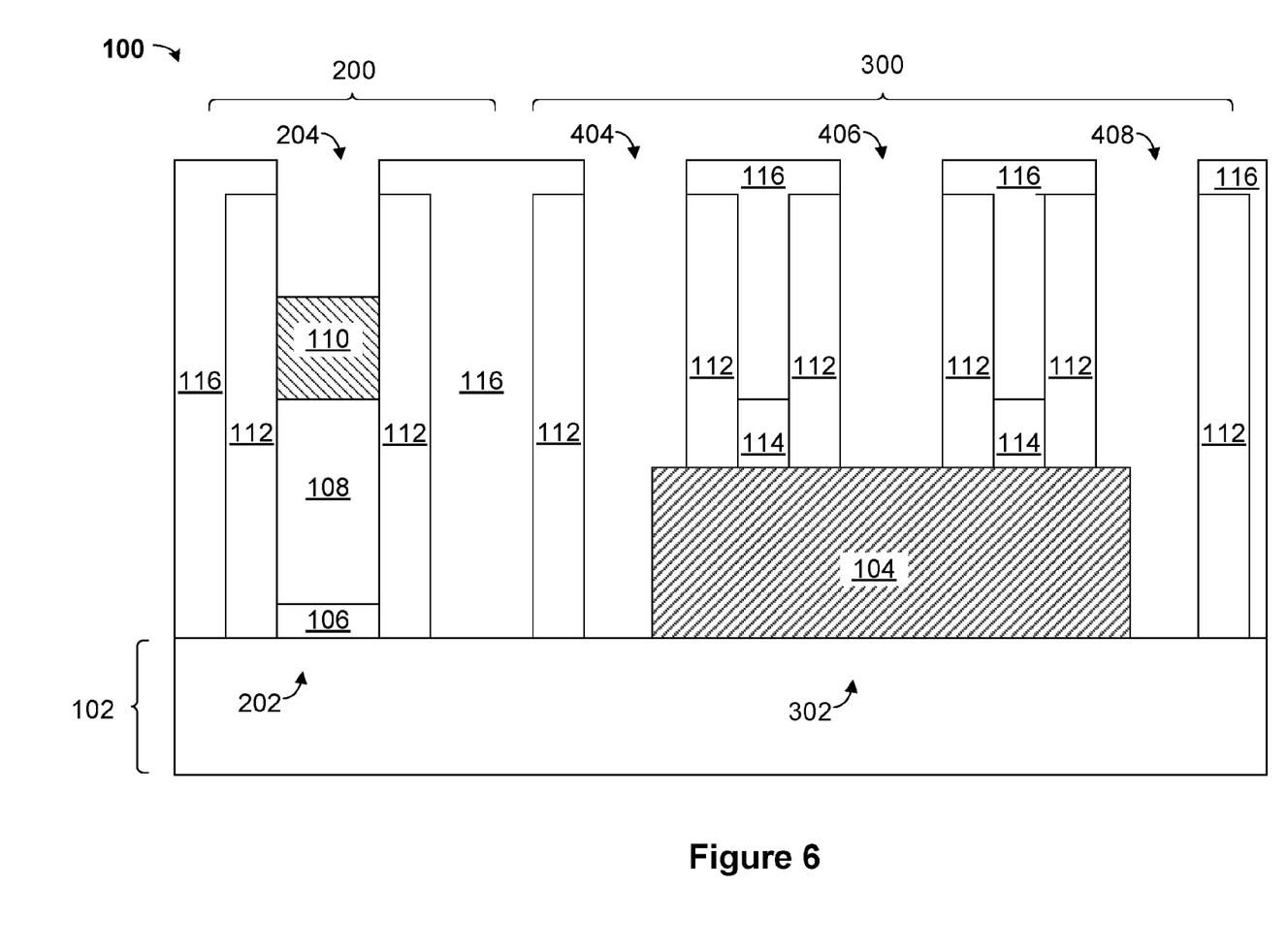
FIG. 6 is a cross-sectional view of the semiconductor structure and illustrates the removal of the second, third and fourth stacks, according to an exemplary embodiment.

Referring now to FIG. 6, the second, the third and the fourth stacks 304, 306, 308, may be selectively etched and removed via any suitable etch process such as RIE, plasma etch, wet etch, or any suitable combination of those etch processes. A portion of the semiconductor layer 108 and a portion of the dielectric layer 106 may be removed selective to the mask 110 and the second dielectric layer 116, resulting in a first opening 404, a second opening 406 and a third opening 408, respectively. A bottom of both the first opening 404 and the third opening 408 may be an exposed top surface of the substrate 102. A side portion of the fin 104 may be exposed in both the first opening 404 and the third opening 408. A top of the fin 104 may be exposed in both the first opening 404 and the third opening 408. A bottom of the second opening 406 may be an exposed top surface of the fin 104.

The remaining portion of the mask 110 in the first stack 204 protects the first stack 204 during the selective etching of the second, third and fourth stacks 304, 306, 308.

Figure 7:
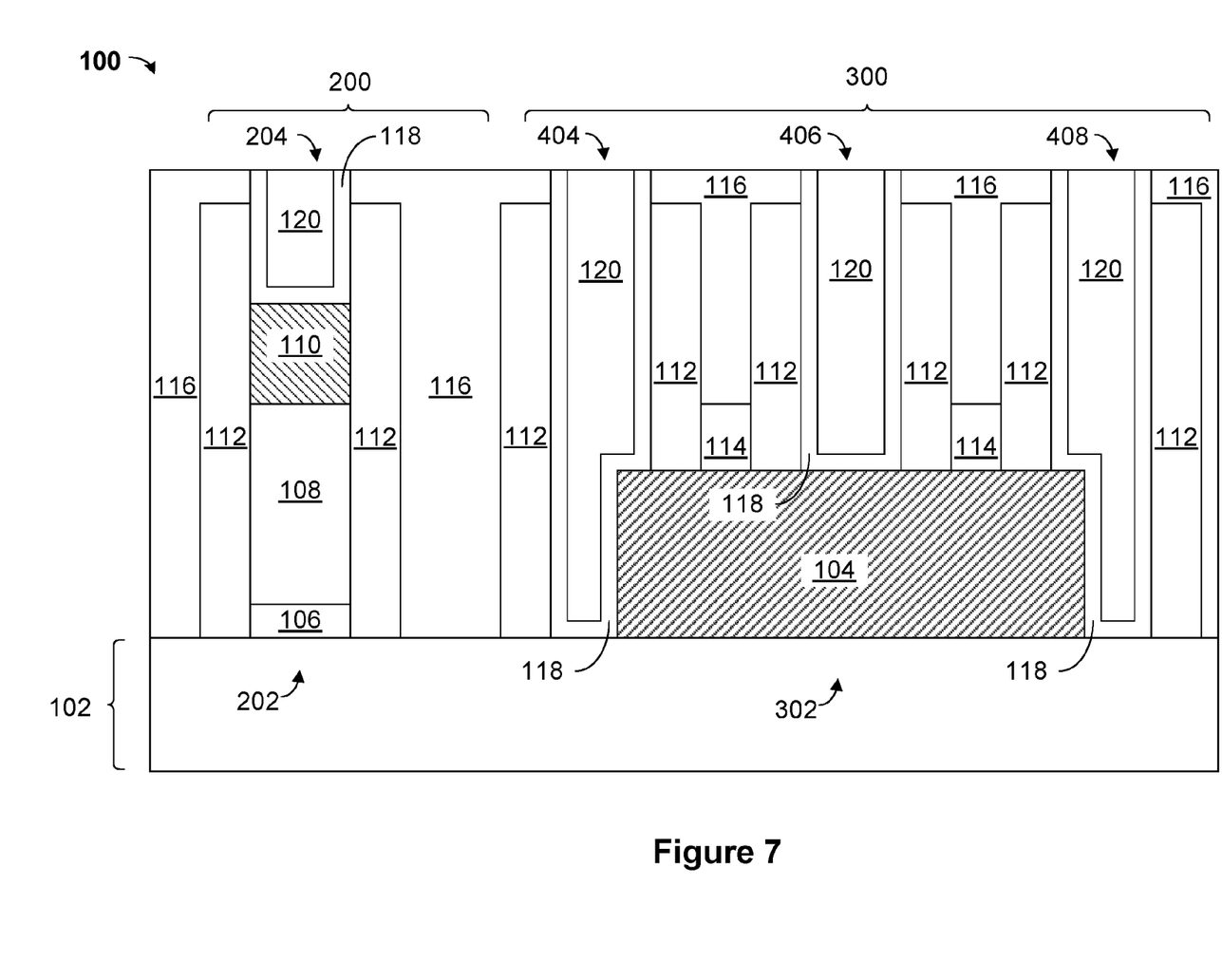
FIG. 7 is a cross-sectional view of the semiconductor structure and illustrates the formation of a dielectric and a conductor, according to an exemplary embodiment.

Referring now to FIG. 7, a dielectric 118 and a conductor 120 may be formed in the first stack 204, and the first, second and the third openings 404, 406, 408. The dielectric 118 in the third opening 406 may serve as a gate dielectric of FET 302, and the conductor 120 in the third opening 406 may serve as a gate of the FET 302. The conductor 120 in the third opening 406 may further include a workfunction setting layer to set a threshold voltage of the FET 302 and another processing layer may be formed to reduce a gate resistance of the FET 302.

The dielectric 118 may be first conformally deposited using typical deposition techniques, for example, atomic layer deposition (ALD), molecular layer deposition (MLD), chemical vapor deposition (CVD), physical vapor deposition (PVD), and spin on techniques. The material of the dielectric 118 may include silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k may further include dopants such as lanthanum, aluminum. In an embodiment, the dielectric 118 may have a thickness ranging from about 2 nm to about 5 nm and ranges there between, although a thickness less than 2 nm and greater than 5 nm may be acceptable.

The conductor 120 may include a conductive material, such as metal. For example, the conductor 120 may include polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further include dopants that are incorporated during or after deposition. The conductor 120 may be deposited using typical deposition techniques, for example, atomic layer deposition (ALD), molecular layer deposition (MLD), chemical vapor deposition (CVD), physical vapor deposition (PVD), and spin on techniques. The dielectric 118 and the conductor 120 may be polished using a chemical mechanical polishing (CMP) technique until a top surface of dielectric 118 and the conductor 120 is substantially coplanar with a top surface of the second dielectric layer 116, as illustrated. Stated differently, top surfaces of the dielectric 118 and the conductor 120 are substantially flush with the top surface of the second dielectric layer 116.

Figure 8:
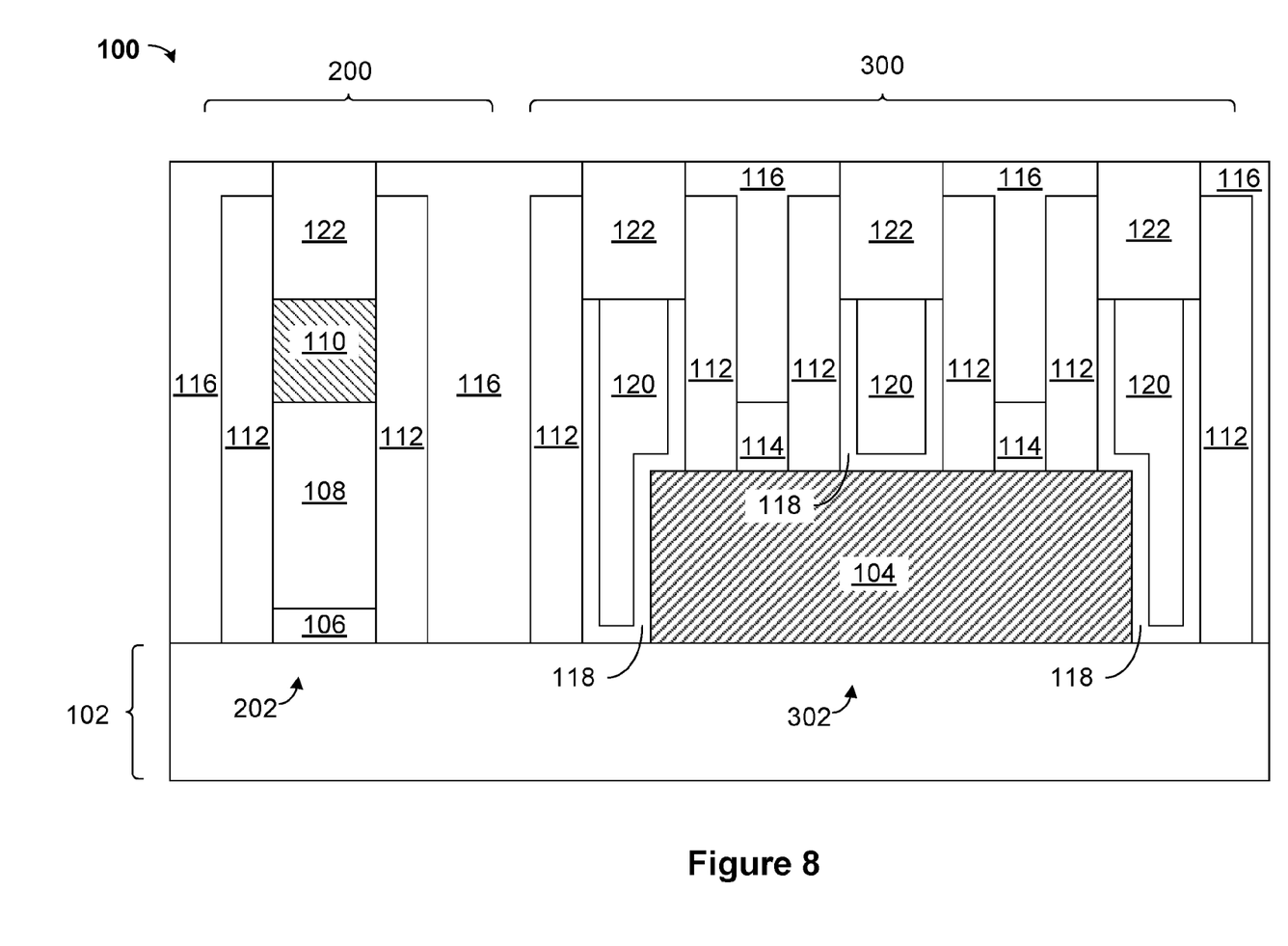
FIG. 8 is a cross-sectional view of the semiconductor structure and illustrates the recess of the dielectric and the conductor, and the formation of a dielectric cap, according to an exemplary embodiment.

Referring now to FIG. 8, the dielectric 118 and the conductor 120 may be recessed until a top surface of the mask 110 in the first stack 204 is exposed. In the first stack 204, the dielectric 118 and the conductor 120 may be removed. The first, second and third fourth openings 404, 406 and 408 may each have an exposed top surface of the dielectric 118 and the conductor 120. In an alternate embodiment, the mask 110 may also be recessed and a top surface of the semiconductor layer 108 is exposed in the first stack 204.

A dielectric cap 122 may be formed in the first stack 204, and the first, second and third openings 404, 406 and 408. The dielectric cap 122 may be formed using typical deposition techniques, for example, atomic layer deposition (ALD), molecular layer deposition (MLD), chemical vapor deposition (CVD), physical vapor deposition (PVD), high density plasma (HDP) deposition, or any suitable combination of those techniques. The material of the dielectric cap 122 may include silicon oxide, silicon nitride, silicon oxynitride, boron nitride, high-k materials, carbon doped silicon oxide, fluorine doped silicon oxide, boron carbon nitride, hydrogen silsesquioxane polymer (HSQ), methyl silsesquioxane polymer (MSQ), organosilicate glass (SiCOH), or any combination of these materials. In an embodiment, the dielectric cap 122 may include silicon nitride deposited using a chemical vapor deposition technique.

The dielectric cap 122 may be polished using a chemical mechanical polishing (CMP) technique until a top surface of each of the dielectric caps 122 are substantially coplanar with the top surface of the second dielectric layer 116, as illustrated. Stated differently, top surface of the dielectric caps 122 are substantially flush with the top surface of the second dielectric layer 116.

Figure 9:
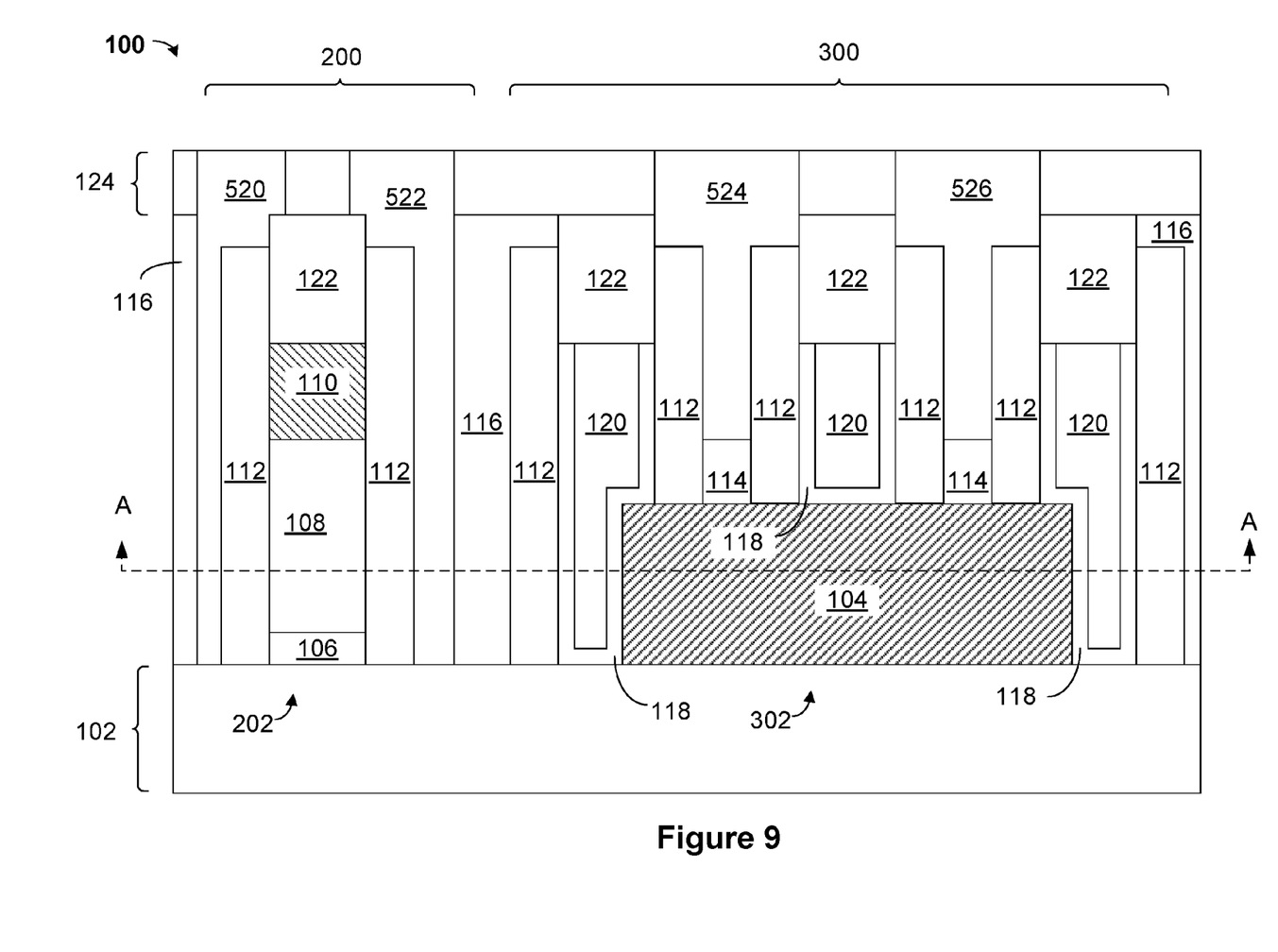
FIG. 9 is a cross-sectional view of the semiconductor structure and illustrates the formation of an opening and a contact, according to an exemplary embodiment.

Referring now to FIG. 9, third dielectric layer 124 may be formed. Portions of the second dielectric layer 116 may be removed by patterning techniques to subsequently be filled with a conductive material to form a first contact 520, a second contact 522, a third contact 524, and a fourth contact 526. The first and second contacts 520, 522 may each have a bottom surface substantially flush with a top surface of the substrate 102. The first and second contacts 520, 522 may each have a vertical surface substantially flush with a side of one of the pair of sidewall spacers 112 of the high voltage transistor 202. The first, second, third and fourth contacts 520, 522, 524, and 526 may include polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further include dopants that are incorporated during or after deposition.

In an embodiment, the first contact 520 and the second contact 522 may be formed in the inactive region 200 and may each serve as a gate for the high voltage transistor 202.

At least one of the first contact 520 and the second contact 522 may be active and turn on the high voltage transistor 202. In an embodiment, the first contact 520 and the second contact 522 may be electrically connected.

The third and fourth contacts 524, 526, may be formed in the active region 300. The third and fourth contacts 524, 526, may each have a bottom surface substantially flush with a top surface of the epitaxy layer 114. The third and fourth contacts 524,526, may each have a vertical surface substantially flush with a side of one of the pair of sidewall spacers 112.

The third dielectric layer 124 may be formed directly on the exposed top surfaces of the structure 100, according to an exemplary embodiment. The third dielectric layer 124 may be made from an insulator material such as an oxide, nitride, oxynitride, silicon carbon oxynitride, silicon boron oxynitride, low-k dielectric, or any combination thereof. The third dielectric layer 124 may be deposited using typical deposition techniques, for example, atomic layer deposition (ALD), molecular layer deposition (MLD), chemical vapor deposition (CVD), physical vapor deposition (PVD), and spin on techniques. In an embodiment, the third dielectric layer 124 may include one or more layers. In an embodiment, the third dielectric layer 124 may have a vertical thickness, or height, ranging from about 30 nm to 100 nm, and ranges there between, although a thickness less than 30 nm and greater than 100 nm may be acceptable.

The second dielectric layer 116 and the third dielectric layer 124 may help insulate the first, second, third and fourth contacts 520, 522, 524, 526 from each other, as illustrated.

Figure 10:
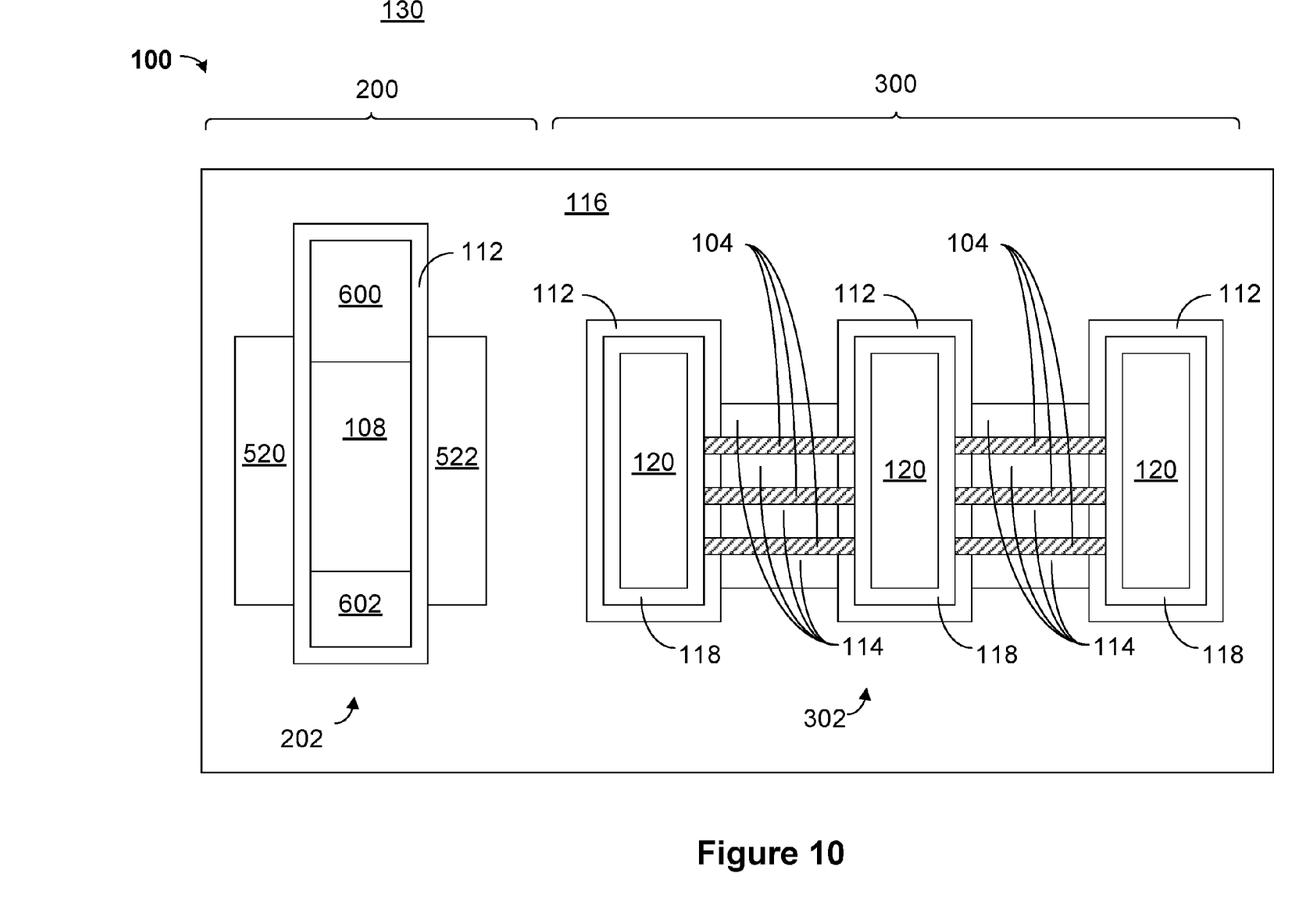
FIG. 10 is a cross-sectional view of the semiconductor structure and illustrates FIG. 9 in an alternate view, according to an exemplary embodiment.

Referring now to FIG. 10, a cross-sectional view of the structure 100 is shown of FIG. 9 is shown along section line AA. As described above, the inactive region 200 includes the high voltage transistor 202, which includes the semiconductor layer 108 of the high voltage transistor 202, surrounded by the pair of sidewall spacers 112 of the high voltage transistor 202. The semiconductor layer 108 may serve as a channel of the high voltage transistor 202. The pair of sidewall spacers 112 may serve as a gate dielectric of the high voltage transistor 202. The first contact 520 may be on an opposite side of the high voltage transistor 202 than the second contact 522. The first contact 520 and the second contact 522 may be electrically insulated to serve as two independent gates of the high voltage transistor 202. Alternatively, the first contact 520 and the second contact 522 may be wired together. The inactive region 200 may also include a first high voltage transistor source drain region 600 and a second high voltage transistor source drain region 602. The first high voltage transistor source drain region 600 and the second high voltage transistor source drain region 602 are not seen in the earlier figures due to the respective area of cross-sectional views. The first high voltage transistor source drain region 600 and the second high voltage transistor source drain region 602 may be doped with dopants such as p-type dopants (such as boron and/or indium) or n-type dopants such as phosphorus, arsenic, and/or antimony). The dopants can be introduced in the first high voltage transistor source drain region 600 and the second high voltage transistor source drain region 602 by any known doping techniques such as ion implantation followed by dopant activation anneal process. Patterning may be used during ion implantation to protect other regions that do not need those dopants.

The active region 300 includes the epitaxy layer 114 and the fin 104. The alternating lines of the epitaxy layer 114 and the fin 104 are the source/drain regions of the FET 302. The dielectric 118 and the pair of sidewall spacers 112 isolate conductor 120 from source/drain regions. The conductor 120 in a center of the active region 300 may be a gate which is used to turn on or turn off the FET 302. The conductor 120 in an outer portion of the active region 300 may serve as a dummy gate to isolate the FET 302 from another device on the structure 100.

An additional metal layer, which includes wires and electrical connections, may be formed on the structure 100. The metal layer may provide connections to each of the first, second, third and fourth contacts 520, 522, 524, 526, as well as the gate and the source/drains of the high voltage transistor 202 and the FET 302.

The high voltage transistor 202 may operate via one or more of the two gates, which are the first contact 520 and the second contact 522, the channel which is the semiconductor layer 108, first high voltage transistor source drain region 600 and the second high voltage transistor source drain region 602. The dielectric 112 in the inactive region 200 serves as the gate dielectric for the high voltage transistor 202.

In order to simplify manufacturing of both CMOS FET and high voltage transistors in the same process flow, this disclosure allows for simultaneously manufacturing one or more high voltage transistors 202 along with other CMOS FETs 302. The structures of the high voltage transistor 202 and the CMOS FET 302 can be formed using the same processes. For example, the pair of sidewall spacers 112 in the inactive region 200 may serve as the gate dielectric for the high voltage transistor 202, while the pair of sidewall spacers 112 in the active region 300 may serve as an isolator between the conductor 120 and the source/drain region and contacts of the FET 302. The first, second, third and fourth contacts 520, 522, 524, and 526 are formed by the same process. The first and second contacts 520 and 522 each serve as a gate conductor of the high voltage transistor 202. Meanwhile, the third and fourth contacts 524 and 526 serve as contacts to the source/drain regions of the CMOS FET 302. The high voltage transistor may be used in a power converter for electronics which require a higher voltage, for example 5V, vs a lower voltage used for CMOS FETs, for example 1V. There are other applications of the high voltage transistor.

As the semiconductor industry evolves, there is a benefit to reduce or combine semiconductor manufacturer process steps. The present invention may allow for the manufacture of devices requiring high voltage transistors, and CMOS FETs.

It may be noted that not all advantages of the present invention are include above.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
   conformally depositing a semiconductor layer on a semiconductor substrate simultaneously in a first region and a second region, wherein a top surface of the semiconductor layer above a fin only in the second region is at a greater height than a top surface of the semiconductor layer in the first region, wherein the height is measured relative to a common surface of the semiconductor substrate;

forming a mask on the semiconductor layer;

simultaneously etching the semiconductor layer and the mask in the first region to expose a top surface of the semiconductor substrate to form a first stack, and the semiconductor layer and the mask in the second region to expose a top surface of the fin to form a second stack;

epitaxially growing a semiconductor material on a top surface of the fin not covered by the second stack nor the second sidewall spacers; and simultaneously recessing the first stack and the second stack to remove the mask and expose a top surface of the semiconductor layer in the second stack, wherein a portion of the mask remains above the semiconductor layer in the first stack, wherein after recessing, a top surface of the remaining portion of the mask in the first stack is substantially flush with the top surface of the semiconductor layer in the second stack.

2. The method according to claim 1, further comprising:
forming a first source drain region in the first region of the semiconductor substrate.

3. The method according to claim 1, further comprising:
forming source drain contacts in the second region of the semiconductor substrate, wherein the source drain contacts are in direct contact with the epitaxially grown semiconductor material.

4. The method according to claim 3, further comprising:
simultaneously forming both a gate in the first region of the semiconductor substrate and the source drain contacts in the second region of the semiconductor substrate.

5. The method according to claim 1, wherein the second region comprises an array of fin field effect transistors.

6. The method according to claim 1, further comprising:
simultaneously forming a first pair of sidewall spacers on opposite sidewalls of the first stack and a second pair of sidewall spacers on opposite sidewalls of the second stack by conformally depositing a dielectric layer and anisotropically etching the dielectric layer from horizontal surfaces of the first stack and the second stack, wherein the first pair of sidewall spacers remains adjacent to the sidewalls of the first stack and the second pair of sidewall spacers remains adjacent to the sidewalls of the second stack.

7. A method comprising:
conformally depositing a semiconductor layer on a semiconductor substrate simultaneously in a first region and a second region, wherein a top surface of the semiconductor layer above a fin only in the second region is at a greater height than a top surface of the semiconductor layer in the first region, wherein the height is measured relative to a common surface of the semiconductor substrate;

forming a mask on the semiconductor layer;

simultaneously forming a first pair of sidewall spacers on opposite sidewalls of a first stack in the first region and a second pair of sidewall spacers on opposite sidewalls of a second stack in the second region by conformally depositing a dielectric layer and anisotropically etching the dielectric layer from horizontal surfaces of the first stack and the second stack, wherein the first pair of sidewall spacers remains adjacent to the sidewalls of the first stack and the second pair of sidewall spacers remains adjacent to the sidewalls of the second stack;

epitaxially growing a semiconductor material on a top surface of the fin not covered by the second stack nor the second sidewall spacers; and simultaneously recessing the first stack and the second stack to remove the mask and expose a top surface of the semiconductor layer in the second stack, wherein a portion of the mask remains above the semiconductor layer in the first stack, wherein after recessing, a top surface of the remaining portion of the mask in the first stack is substantially flush with the top surface of the semiconductor layer in the second stack.

8. The method according to claim 7, further comprising:
forming a gate adjacent to and in direct contact with at least one of the first pair of sidewall spacers.

9. The method according to claim 7, further comprising:
forming a first source drain region in the first region of the semiconductor substrate.

10. The method according to claim 7, further comprising:
forming source drain contacts in the second region of the semiconductor substrate, wherein the source drain contacts are in direct contact with the epitaxially grown semiconductor material.

11. The method according to claim 7, wherein the second region comprises an array of fin field effect transistors.

12. The method according to claim 7, further comprising:
recessing the second stack to expose the top surface of the fin.

13. The method according to claim 7, further comprising:
simultaneously forming both a gate in the first region of the semiconductor substrate and source drain contacts in the second region of the semiconductor substrate.

* * * * *